US007813166B2

(12) United States Patent
Jung et al.

(10) Patent No.: US 7,813,166 B2
(45) Date of Patent: Oct. 12, 2010

(54) CONTROLLED VALUE REFERENCE SIGNAL OF RESISTANCE BASED MEMORY CIRCUIT

(75) Inventors: Seong-Ook Jung, San Diego, CA (US); Jisu Kim, Seoul (KR); Jee-Hwan Song, Seoul (KR); Seung H. Kang, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 193 days.

(21) Appl. No.: 12/164,436

(22) Filed: Jun. 30, 2008

(65) Prior Publication Data

US 2009/0323405 A1    Dec. 31, 2009

(51) Int. Cl.
*G11C 7/00* (2006.01)
(52) U.S. Cl. .................................. 365/158; 365/173
(58) Field of Classification Search ................ 365/158, 365/173
See application file for complete search history.

(56) References Cited

U.S. PATENT DOCUMENTS

| 5,812,451 | A | 9/1998 | Iwata |
| 6,501,697 | B1 | 12/2002 | Perner et al. |
| 6,809,976 | B2 | 10/2004 | Ooishi |
| 6,819,601 | B2 | 11/2004 | Eliason et al. |
| 6,922,355 | B2 | 7/2005 | Hidaka |
| 7,123,514 | B2 | 10/2006 | Watanabe |
| 2004/0017718 | A1* | 1/2004 | Ooishi ........................ 365/210 |
| 2004/0208052 | A1* | 10/2004 | Hidaka ........................ 365/158 |
| 2005/0219905 | A1* | 10/2005 | Watanabe .............. 365/185.21 |

OTHER PUBLICATIONS

International Search Report-PCT/US2009/048301, International Search Authority-European Patent Office—Aug. 25, 2009.
Written Opinion-PCT/US2009/048301, International Search Authority-European Patent Office Aug. 25, 2009.
Hosomi, M. et al., "A Novel nonvolatile memory with spin torque transfer magnetization switching: spin-ram", Electron Devices Meeting, 2005, IEDM Technical Digest, IEEE International, Dec. 5-7, 2005, pp. 459-462.
Iwata, Y. et al., "A 16Mb MRAM with FORK Wiring Scheme and Burst Modes", Solid State Circuits, 2006 IEEE International Conference Digest of Technical Papers, Feb. 6-9, 2006, pp. 477-486.

\* cited by examiner

*Primary Examiner*—Michael T Tran
(74) *Attorney, Agent, or Firm*—Michelle Gallardo; Nicholas J. Pauley; Sam Talpalatsky

(57) ABSTRACT

Systems and methods of controlled value reference signals of resistance based memory circuits are disclosed. In a particular embodiment, a circuit device is disclosed that includes a first input configured to receive a reference control signal. The circuit device also includes an output responsive to the first input to selectively provide a controlled value reference voltage to a sense amplifier coupled to a resistance based memory cell.

19 Claims, 10 Drawing Sheets

US 7,813,166 B2

CONTROLLED VALUE REFERENCE SIGNAL OF RESISTANCE BASED MEMORY CIRCUIT

I. FIELD

The present disclosure is generally related to controlled value reference signals of resistance based memory circuits.

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. However, power consumption of such portable devices can quickly deplete a battery and diminish a user's experience.

Reducing power consumption has led to smaller circuitry feature sizes and operating voltages within such portable devices. Reduction of feature size and operating voltages, while reducing power consumption, also increases sensitivity to variations between manufacturing processes. Such increased sensitivity may be difficult to overcome when designing memory devices that use sense amplifiers where a manufacturer or manufacturing process is not known or may be subject to change.

III. SUMMARY

Research conducted by Professor Seong-Ook Jung, Jisu Kim, and Jee-Hwan Song of Yonsei University, in conjunction with Seung H. Kang and Sei Seung Yoon of Qualcomm Inc., has resulted in novel systems and methods of controlled value reference signals of resistance based memory circuits.

In a particular embodiment, a circuit device is disclosed that includes a first input configured to receive a reference selection signal. The circuit device also includes an output responsive to the first input to selectively provide a controlled value reference voltage to a sense amplifier coupled to a resistance based memory cell.

In another particular embodiment, a sense amplifier is disclosed that includes a first input coupled to at least one magnetoresistive random access memory (MRAM) bit cell. The sense amplifier also includes a second input adapted to receive an input signal comprising a controlled value reference voltage.

In another particular embodiment, a variable reference signal generator for a resistance based memory device is disclosed. The variable reference signal generator includes an input to receive a control signal and an output responsive to the input. The variable reference signal generator also includes logic to provide a controlled value reference signal at the output for use in connection with a sense amplifier of the resistance based memory device.

In another particular embodiment, a magnetoresistive random access memory (MRAM) device is disclosed. The MRAM device includes a data cell coupled to a first load element to generate a data signal responsive to a data value stored at the data cell. The MRAM device also includes a reference cell to generate a controlled value reference signal. The MRAM device includes a load generator cell coupled to provide a load control signal to the first load element. The MRAM device further includes a sense amplifier coupled to receive the controlled value reference signal and the data signal and to generate an output that indicates the data value.

In another particular embodiment, a method is disclosed that includes providing a control signal to adjust a value of a reference signal at a magnetic random access memory (MRAM) device. A value of a bit cell of the MRAM device is determined based on a comparison of a data read signal to the reference signal.

A particular advantage provided by disclosed embodiments is that operation of a variable resistance memory may be improved by using a controlled reference signal. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
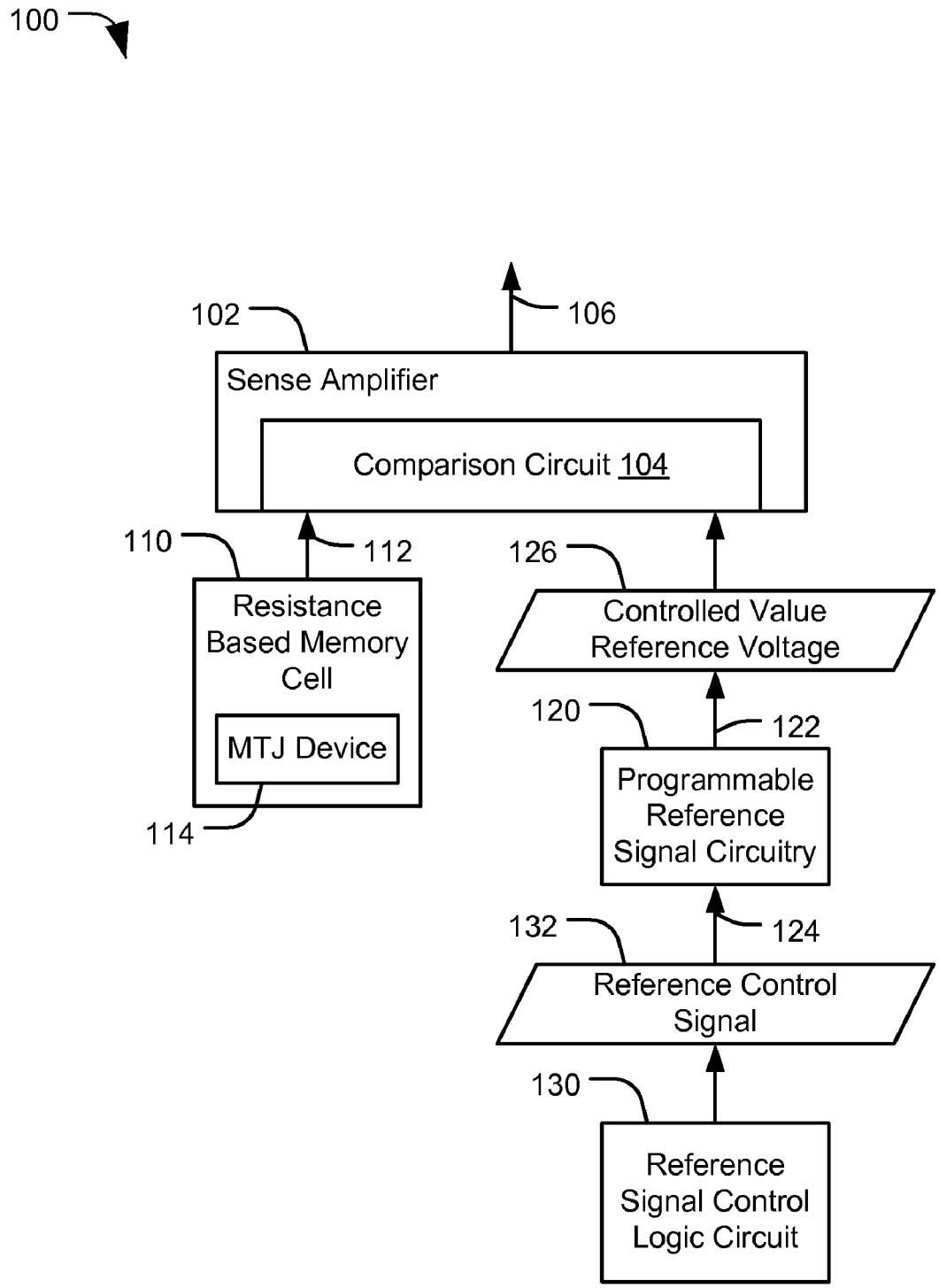
FIG. 1 is a block diagram of a particular illustrative embodiment of a resistance based memory system including a programmable reference signal.

Referring to FIG. 1, a particular illustrative embodiment of a resistance based memory system including a programmable reference signal is depicted and generally designated 100. A sense amplifier 102 is coupled to a representative resistance based memory cell 110 and to programmable reference signal circuitry 120. A reference signal control logic circuit 130 is coupled to provide a reference control signal 132 to the programmable reference signal circuitry 120. By controlling a reference voltage provided to the sense amplifier 102 in response to the reference control signal 132, an overall sense margin of the resistance based memory system 100 can be improved to accommodate different types of process variations affecting resistance based memory cells such as the cell 110.

The representative resistance based memory cell 110 is configured to store a logic "1" value or a logic "0" value using a resistance based memory device. In a particular embodiment, the resistance based memory cell 110 includes a magnetic tunnel junction (MTJ) device 114 that exhibits a first resistance (R0) corresponding to a logic "0" state and a second resistance (R1) corresponding to a logic "1" state. Values of the first resistance R0 and the second resistance R1 may vary compared to other memory cells (not shown) of the system 100, for example due to process variations during manufacturing of the system 100.

The programmable reference signal circuitry 120 includes an input 124 configured to receive the reference control signal 132 from the reference signal control logic circuit 130. The programmable reference signal circuitry 120 has an output 122 responsive to the input 124 to selectively provide the controlled value reference voltage 126 to the sense amplifier 102. For example, the programmable reference signal circuitry 120 may be responsive to the reference control signal 132 to select a single reference cell output from multiple reference cells to provide to the sense amplifier 102, as will be discussed with respect to the reference selection signal 216 of FIG. 2. As another example, the programmable reference signal circuitry 120 may be responsive to the reference control signal 132 to adjust an output value of a single reference cell, as will be discussed with respect to the control input 386 of FIG. 3.

During operation, a data value stored at the representative resistance based memory cell 110 is determined by providing a signal 112 representing an output voltage to a comparison circuit 104 of the sense amplifier 102. The comparison circuit 104 compares the signal 112 to the controlled value reference voltage 126. The sense amplifier 106 amplifies a result of the comparison to provide an output signal 106 that indicates the data value stored at the representative resistance based memory cell 110.

Generally, the system 100 is least susceptible to noise and other environmental factors when the controlled value reference voltage 126 is centered between the read voltage of the resistance based memory cell 110 at the logic "0" state and the read voltage of the logic "1" state, thus maximizing the sense margin of the cell 110. Because of manufacturing process variations, the read voltages will vary from cell to cell. However, as will be discussed in relation to FIGS. 5-10, such process variations may be generally categorized, and the reference selection signal 132 may be determined based on a category of the process variation.

As a result, the reference control signal 132 may be determined based on sense margin sensitivity information associated with the system 100. For example, the sense margin sensitivity information may be based on distributions of resistance values of the resistance based memory cells. The sense margin sensitivity information may include cell-by-cell information, chip-by-chip information, multi-chip information, or process based information.

By configuring the reference signal control logic circuit 130 to determine an appropriate controlled value reference voltage 126 via the reference control signal 132, the system 100 may operate at an overall sense margin that is substantially statistically optimal based on the sense margin sensitivity information. Thus, the system 100 may be manufactured at a particular facility using a particular process, and then characterized and programmed to provide an appropriate controlled value reference voltage 126 based on the characterization results of the particular process to improve an overall sense margin of the system 100.

Figure 2:
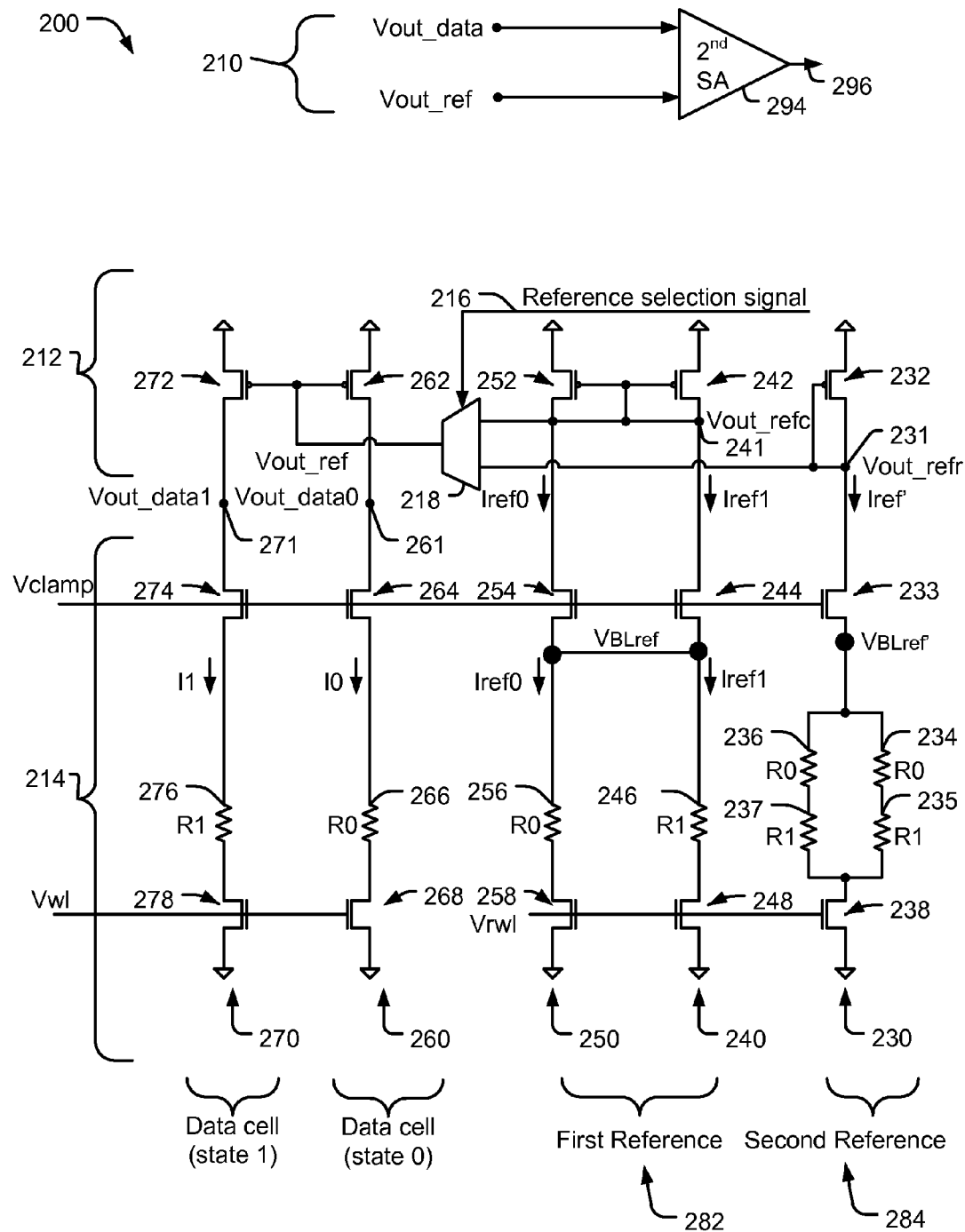
FIG. 2 is a circuit diagram of a first illustrative embodiment of a resistance based memory including a controlled value reference signal.

Referring to FIG. 2, a circuit diagram of a first illustrative embodiment of a resistance based memory including a controlled value reference signal is depicted and generally designated 200. The memory 200 may correspond to the system 100 of FIG. 1. The memory 200 includes a first reference cell 282 having a first reference path 240 and a second reference path 250. A second reference cell 284 has a single reference path 230. The memory 200 also includes a representative state "0" data cell 260 and a representative state "1" data cell 270. The reference paths 230, 240, and 250 and the data paths 260 and 270 are generally designated as having a sense amplifier portion 212 that provides load elements to a memory cell portion 214 to generate an output signal for comparison at a second sense amplifier portion 210. The sense amplifier portion 212 of the data cells 260 and 270 is responsive to a reference selection signal 216 to select a first controlled value reference voltage (Vout_refc) provided by the first reference cell 282 or a second controlled value reference voltage (Vout_refr) provided by the second reference cell 284. In a particular embodiment, the reference selection signal 216 is configured to choose Vout_refc or Vout_refr to improve sense margins based on process variations.

The first reference path 240 of the first reference cell 282 includes a load device, such as a p-channel metal oxide semiconductor (PMOS) field effect transistor load 242. The PMOS load 242 is coupled to a reference node 241 that provides the first controlled value reference voltage Vout_refc. The reference node 241 is also coupled to a clamp transistor 244. A resistance R1 246 corresponding to a logic "1" state of a resistance based memory element is coupled to the clamp transistor 244. In a particular embodiment, the resistance based memory element is a magnetic tunnel junction (MTJ) device. An access transistor 248 is coupled to the resistance R1 246.

The second reference path 250 of the first reference cell 282 includes a load device, such as a PMOS load 252. The PMOS load 252 is coupled to the reference node 241, which in turn is coupled to a clamp transistor 254. A resistance R0 256 corresponding to a logic "0" state of a resistance based memory element is coupled to the clamp transistor 254. An access transistor 258 is coupled to the resistance R0 256.

The single path 230 of the second reference cell 284 includes a load device, such as a PMOS load 232. The PMOS load 232 is coupled to a reference node 231 that provides the second controlled value reference voltage Vout_refr. The reference node 231 is also coupled to a clamp transistor 233. A first path including a resistance R0 234 serially coupled to a resistance R1 235 is coupled to the clamp transistor 233 in parallel with a second path including a resistance R0 236 serially coupled to a resistance R1 237. The resistances R1 235 and R1 237 are coupled to an access transistor 238. The resistances R0 234 and 236 correspond to a resistance based memory element in a "bit-zero" or logic "0" state and the resistances R1 235 and 237 correspond to a resistance based memory element in a "bit-one" or logic "1" state.

The representative state "0" data cell 260 includes a load device, such as a PMOS load 262. The PMOS load 262 is coupled to a reference node 261 which in turn is coupled to a clamp transistor 264. A resistance based memory element having a logic "0" state is represented as a resistance R0 266, which is coupled to the clamp transistor 264. An access transistor 268 is coupled to the resistance R0 266.

The representative state "1" data cell 270 includes a load device, such as a PMOS load 272. The PMOS load 272 is coupled to a reference node 271 which in turn is coupled to a clamp transistor 274. A resistance based memory element having a logic "1" state is represented as a resistance R1 276, which is coupled to the clamp transistor 274. An access transistor 278 is coupled to the resistance R1 276.

Generally, corresponding components of each of the paths 230, 240, 250, 260, and 270 have similar configurations and operate in a substantially similar manner. Each of the clamp transistors 233, 244, 254, 264, and 274 functions to limit current and voltage through the respective paths 230, 240, 250, 260, and 270 based on a common gate voltage, Vclamp. Each of the access transistors 238, 248, and 258 selectively allows current flow through the respective paths 230, 240, and 250 based on a common gate voltage, Vrwl. Each of the access transistors 268 and 278 selectively allows current flow through the respective paths 260 and 270 based on another common gate voltage, Vwl.

Each PMOS load device 242 and 252 of the first reference cell 282 has a gate terminal that is coupled to the reference node 241. The PMOS load device 232 of the second reference cell 284 has a gate terminal that is coupled to the reference node 231. A programmable selection circuit, such as a multiplexer 218, has a first input coupled to the reference node 241 to receive the first controlled value reference voltage Vout_refc, and a second input coupled to the reference node 231 to receive the second controlled value reference voltage Vout_refr. The multiplexer 216 is responsive to the reference selection signal 216 to provide Vout_refc or Vout_refr as the reference voltage Vout_ref to the gate terminals of the PMOS load devices 262 and 272 of the data cells 260 and 270, respectively.

The second sense amplifier portion 210 includes a sense amplifier device 294 that is coupled to receive a data signal Vout_data corresponding to a voltage of a data cell that is selected for a data read operation, such as the voltage Vout_data0 at the node 261 of the representative state "0" data cell 260, or the voltage Vout_data1 at the node 271 of the representative state "1" data cell 270. The sense amplifier device 294 is also coupled to receive the reference voltage Vout_ref that is provided by the multiplexer 218. The sense amplifier device 294 generates an output 296 in response to a comparison of the data signal Vout_data and the reference signal Vout_ref.

During operation, each of the first reference cell 282 and the second reference cell 284 generate distinct reference voltages, Vout_refc and Vout_refr respectively, according to the particular cell configuration. The first reference cell 282 is configured to generate a reference voltage according to a current mean reference scheme, with the current mean given by $$I_{ref} = \frac{I_{ref0} + I_{ref1}}{2} = \frac{V_{BLref}}{2} \cdot \left( \frac{1}{R_0 + R_{ON}} + \frac{1}{R_1 + R_{ON}} \right)$$

where $R_{ON}$ is the resistance of the access transistor 248 or 258. The second reference cell 284 is configured to generate a reference voltage according to a resistance mean reference scheme, with the resistance mean given by $$R_{ref} = \frac{R_0 + R_1}{2}$$

so that a current Iref' through the second reference cell 284 is given by $$I'_{ref} = \frac{V_{BLref'}}{(R_1 + R_0)/2 + R_{ON}} = V_{BLref'} \frac{1}{(R_1 + R_0)/2 + R_{ON}}$$

Generally, it can be shown that when $V_{BLref} = V_{BLref'} = V_{BL}$

Iref is greater than Iref':

$$I_{ref} - I'_{ref} = V_{BL} \left[ \frac{(R_{MTJ\_0} + R_{MTJ\_1})/2 + R_{ON}}{(R_{MTJ\_0} + R_{ON})(R_{MTJ\_1} + R_{ON})} - \frac{1}{(R_{MTJ\_0} + R_{MTJ\_1})/2 + R_{ON}} \right] > 0$$

In a particular embodiment, a signal margin ΔV, such as a sense amplifier margin, corresponds to a difference between a voltage Vout_data at the reference node 271 of the state "1" data cell 270 and a reference voltage (Vout_refc or Vout_refc) (ΔV₁), or a difference between the reference voltage (Vout_refc or Vout_refr) and a voltage Vout_data at the reference node 261 of the state "0" data cell 260 (ΔV₀), whichever is smaller. Operation of the memory 200 may be improved by selecting the reference voltage Vout_refc or Vout_refr that increases the overall sense margin for data cells that are coupled to the reference cells 282 and 284.

As discussed with respect to FIG. 1, because of process variations, the output voltages Vout_data may vary from cell to cell. However, as will be discussed in relation to FIGS. 5-10, such process variations may be generally categorized, and the reference selection signal 216 may be determined based on a category of the process variation. For example, the reference selection signal 216 may be set at a register, latch, or other data storage device of the memory 200 based on distributions of resistance values of the memory based cells. The reference selection signal 216 may be set based on cell-by-cell information, chip-by-chip information, multi-chip information, or process based information.

Figure 3:
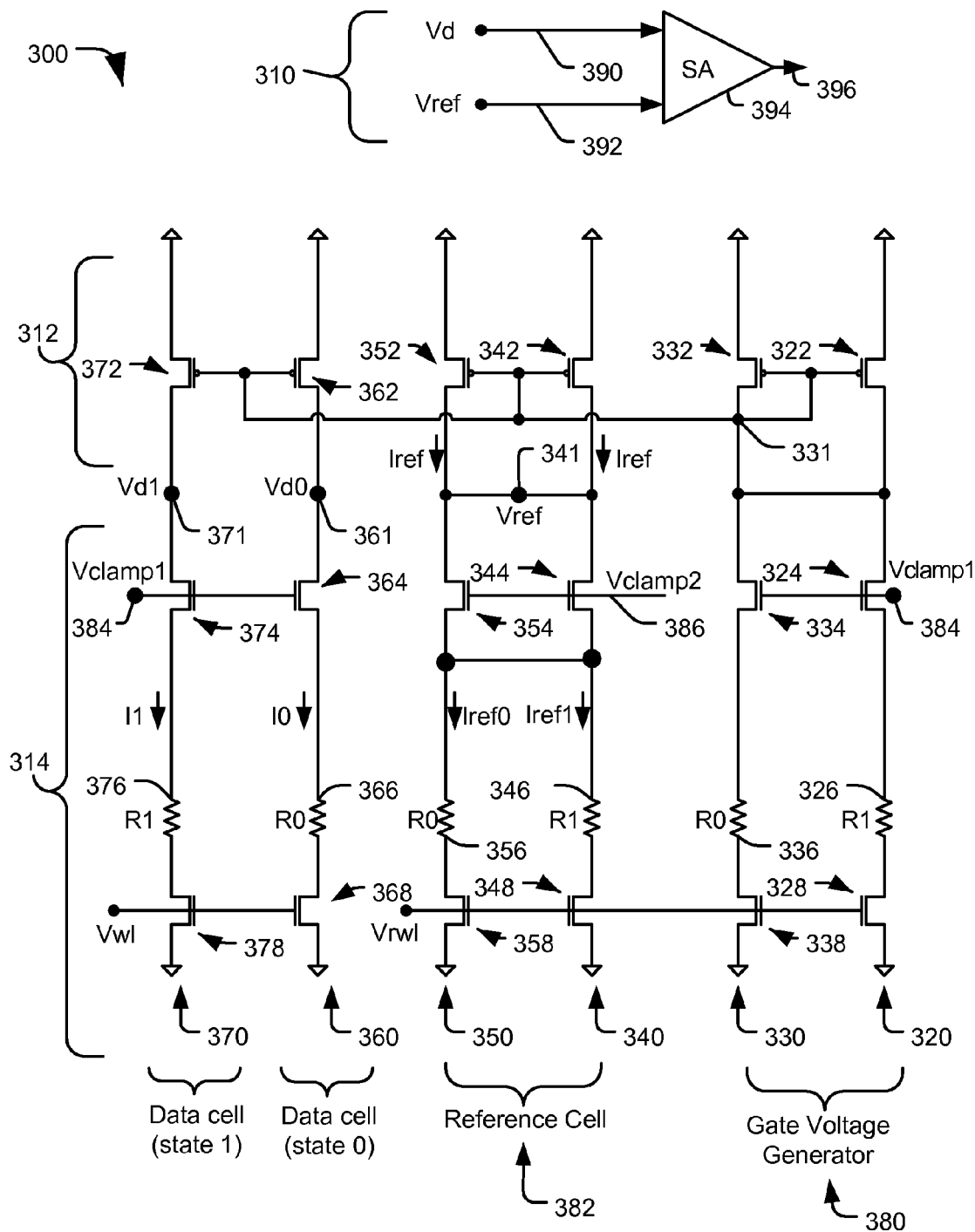
FIG. 3 is a circuit diagram of a second illustrative embodiment of a resistance based memory including a controlled value reference signal.

Referring to FIG. 3, a circuit diagram of a second illustrative embodiment of a resistance based memory including a controlled value reference signal is depicted and generally designated 300. The memory 300 may correspond to the system 100 of FIG. 1. The memory 300 includes a gate voltage generator 380 having a first generator path 320 and a second generator path 330. A reference cell 382 has a first reference path 340 and a second reference path 350. The memory 300 also includes a representative state "0" data cell 360 and a representative state "1" data cell 370. The generator paths 320 and 330, the reference paths 340 and 350, and the data paths 360 and 370 are generally designated as having a sense amplifier portion 312 that provides load elements to a memory cell portion 314 to generate an output signal for comparison at a second sense amplifier portion 310. In a particular embodiment, the reference cell 382 is a magnetoresistive random access memory (MRAM) reference cell that is configured to adjust a controlled value reference voltage (Vref) in response to a control input 386 to improve sense margins based on process variations.

The first reference path 340 of the reference cell 382 includes a load device, such as a p-channel metal oxide semiconductor (PMOS) field effect transistor load 342. The PMOS load 342 is coupled to a reference node 341 that provides the controlled value reference voltage Vref. The reference node 341 is also coupled to a clamp transistor 344. A resistance R1 346 corresponding to a logic "1" state of a resistance based memory element is coupled to the clamp transistor 344. In a particular embodiment, the resistance based memory element is a magnetic tunnel junction (MTJ) device. An access transistor 348 is coupled to the resistance R1 346.

The second reference path 350 of the reference cell 382 includes a load device, such as a PMOS load 352. The PMOS load 352 is coupled to the reference node 341, which in turn is coupled to a clamp transistor 354. A resistance R0 356 corresponding to a logic "0" state of a resistance based memory element is coupled to the clamp transistor 354. An access transistor 358 is coupled to the resistance R0 356.

The first path 320 of the gate voltage generator 380 includes a load device, such as a PMOS load 322. The PMOS load 322 is coupled to a node 331 that is also coupled to a clamp transistor 324. A resistance based memory element having a logic "1" state is represented as a resistance R1 326, which is coupled to the clamp transistor 324. An access transistor 328 is coupled to the resistance R1 326.

The second path 330 of the gate voltage generator 380 includes a load device, such as a PMOS load 332. The PMOS load 332 is coupled to the node 331, which is also coupled to a clamp transistor 334. A resistance based memory element having a logic "0" state is represented as a resistance R0 336, which is coupled to the clamp transistor 334. An access transistor 338 is coupled to the resistance R0 336.

The representative state "0" data cell 360 includes a load device, such as a PMOS load 362. The PMOS load 362 is coupled to a reference node 361 which in turn is coupled to a clamp transistor 364. A resistance based memory element having a logic "0" state is represented as a resistance R0 366, which is coupled to the clamp transistor 364. An access transistor 368 is coupled to the resistance R0 366.

The representative state "1" data cell 370 includes a load device, such as a PMOS load 372. The PMOS load 372 is coupled to a reference node 371 which in turn is coupled to a clamp transistor 374. A resistance based memory element having a logic "1" state is represented as a resistance R1 376, which is coupled to the clamp transistor 374. An access transistor 378 is coupled to the resistance R1 376. In a particular embodiment, the data cells 360 and 370 are MRAM bit cells, such as spin torque transfer MRAM (STT-MRAM) bit cells that include magnetic tunneling junction (MTJ) devices.

Generally, corresponding components of each of the paths 320, 330, 340, 350, 360, and 370 have similar configurations and operate in a substantially similar manner. Each PMOS load device 322, 332, 342, 352, 362, and 372 has a gate terminal that is coupled to the reference node 331 to receive a common load control signal. Each of the access transistors 368 and 379 of the data cells selectively allows current flow through the respective paths 360 and 370 based on a first common gate voltage Vwl. Each of the access transistors 328, 338, 348, and 358 of the reference cell 382 and the gate voltage generator 380 selectively allows current flow through the respective paths 320, 330, 340, and 350 based on a second common gate voltage Vrwl.

Each of the clamp transistors 324, 334, 344, 354, 364, and 374 functions to limit current and voltage through the respective paths 320, 330, 340, 350, 360, and 370. The clamp transistors 324 and 334 of the gate voltage generator 380 and the clamp transistors 364 and 374 of the data cells 360 and 370 each has a gate terminal that is coupled to a node 384 that is biased at a first gate voltage Vclamp1. Each clamp transistors 344 and 354 of the reference cell 382 has a gate terminal that is coupled to receive a second gate voltage Vclamp2 via the control input 386. In a particular embodiment, Vclamp2 is independent of Vclamp 1.

The second sense amplifier portion 310 includes a sense amplifier device 394 that has a first input 390 coupled to receive a data signal Vd from a selected data cell, such as Vd0 at the node 361 of the state "0" data cell 360 or Vd1 at the node 371 of the state "1" data cell 370. The sense amplifier device 394 has a second input 392 coupled to receive the controlled value reference voltage Vref from the reference node 341. The sense amplifier device 394 generates an output 396 in response to a comparison of the data signal Vd and the reference signal Vref.

The controlled value reference voltage Vref is programmable to enhance a sense margin of the memory 300. Although the reference cell 382 has the current mean reference configuration of the first reference cell 282 of FIG. 2, by varying the gate voltage Vclamp2 at the clamp transistors 344 and 354, a current Iref through the reference cell 382 can be set as low as the current Iref' of the resistance mean reference scheme of the second reference cell 284 of FIG. 2. By using the separate gate voltage generator 380 to provide a common gate voltage to the PMOS loads 322, 332, 342, 352, 362, and 372, the current Iref through the reference cell 382 can be varied without changing the currents I0 and I1 through the data cells 360 and 370, respectively. Thus, the gate generator 380 and the reference cell 382 enable Vref to be programmed within a continuous range of values extending substantially from a current mean reference scheme reference value to a resistance mean reference scheme reference value. Compared to the memory 200 of FIG. 2, which limits reference signal selection to the current mean reference scheme or the resistance mean reference scheme, the continuous reference signal selection of the memory 300 enables more accurate sense margin adjustment.

A value of Vclamp2 may be determined via a logic circuit (not shown), received via a register interface, or set at a register, latch, or other data storage device of the memory 300 based on distributions of resistance values of the memory based cells. The value of Vclamp2 may be set based on cell-by-cell information, chip-by-chip information, multi-chip information, or process based information.

Although the reference signals and data signals of FIGS. 2 and 3 are depicted and described as voltage levels, in other embodiment the reference and data signals may be based on current levels and not voltage levels. In addition, the systems depicted in FIG. 2 or 3 may be implemented as a magnetoresistive random access memory (MRAM), a phase-change random access memory (PRAM), or a spin torque transfer MRAM (STT-MRAM), as illustrative, non-limiting examples of resistance-based memory systems.

Figure 4:
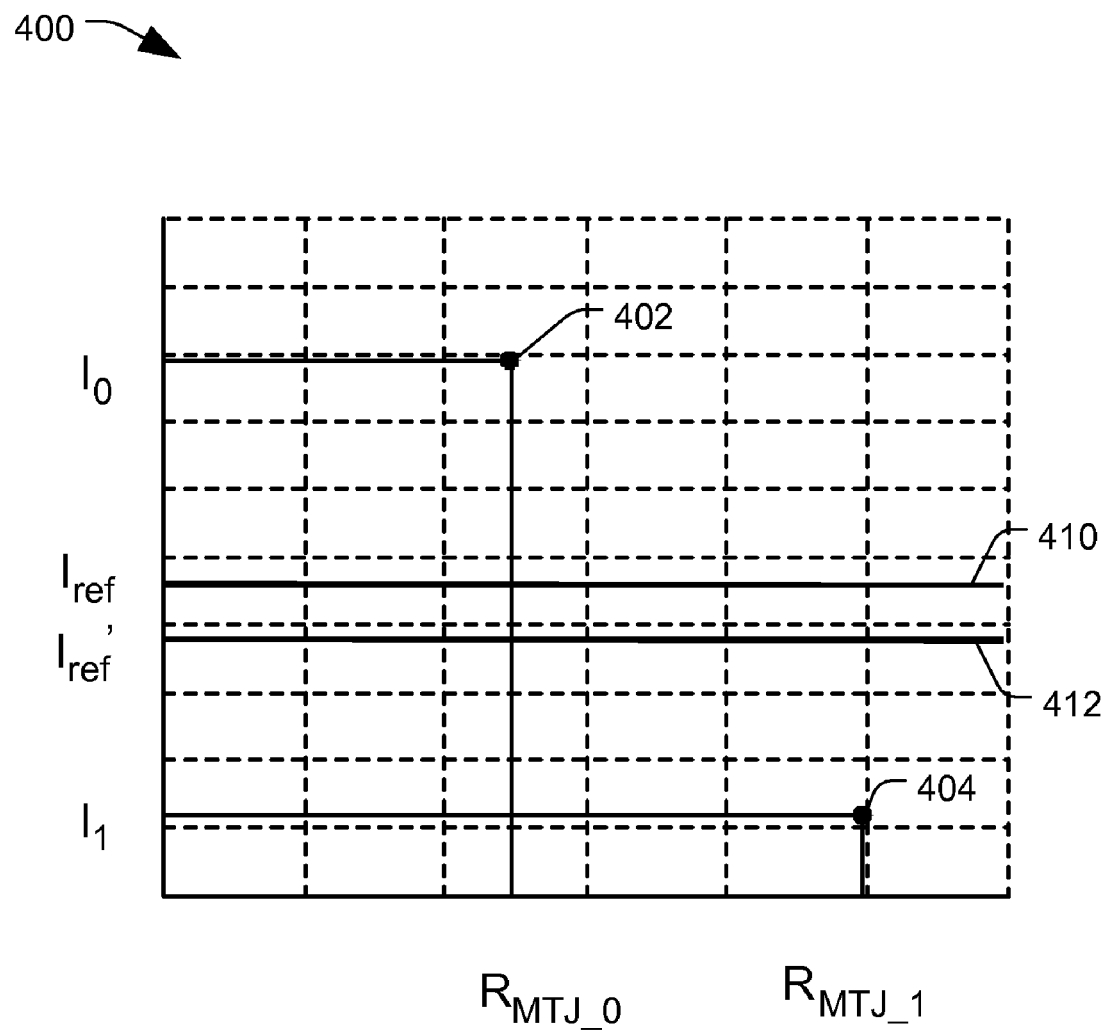
FIG. 4 is a diagram of a particular illustrative embodiment of circuit characteristics of the resistance based memory of FIG. 2.

Referring to FIG. 4, a particular illustrative embodiment of circuit characteristics of a resistance based memory is depicted and generally designated 400. A first operating point 402 illustrates a current $I_0$ corresponding to a logic "0" value stored at a magnetic tunnel junction (MTJ) resistance based memory element having a resistance $R_{MTJ\_0}$, such as the current I0 and the resistance R0 266 in the state "0" data cell 260 of FIG. 2, or the current I0 and the resistance R0 366 in the state "0" data cell 360 of FIG. 3. Similarly, a second operating point 404 illustrates a current $I_1$ corresponding to a logic "1" value stored at a magnetic tunnel junction (MTJ) resistance based memory element having a resistance $R_{MTJ\_1}$, such as the current I1 and the resistance R1 276 in the state "1" data cell 270 of FIG. 2, or the current I1 and the resistance R1 376 in the state "1" data cell 370 of FIG. 3.

A current $I_{ref}$ 410 corresponds to a current through a reference cell having a current mean reference scheme, such as the first reference cell 282 of FIG. 2. A current $I_{ref}$ 412 corresponds to a current through a reference cell having a resistance mean reference scheme, such as the second reference cell 284 of FIG. 2. As will be demonstrated with respect to FIGS. 5-7 and FIGS. 8-10, selection of the current $I_{ref}$ 410 or the current $I_{ref}$ 412 may be based on a variance or distribution of the operating points 402 and 404.

Figure 5:
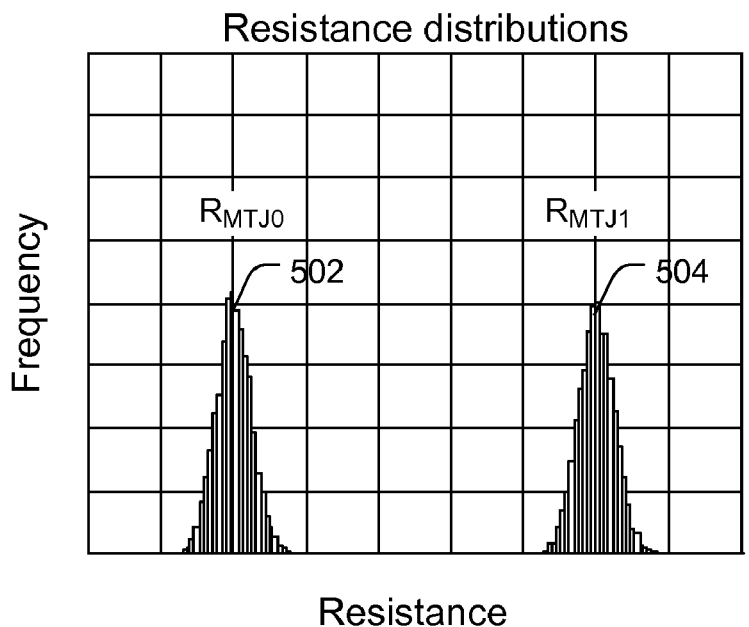
FIG. 5 is a diagram of a particular illustrative embodiment of memory cell resistances exhibiting a first memory cell resistance distribution characteristic.

Referring to FIG. 5, a particular illustrative embodiment of memory cell resistances exhibiting a first memory cell resistance distribution characteristic is depicted and generally designated 500. FIG. 5 generally represents a histogram of resistance values of magnetic tunnel junction (MTJ) devices, showing a first distribution 502 corresponding to a "0" state $R_{MTJ0}$ and a second distribution 504 corresponding to a "1" state $R_{MTJ1}$. As illustrated, the first distribution 502 and the second distribution 504 are roughly equivalent. In particular, the standard deviation of the first distribution 502 is roughly equal to the standard deviation of the second distribution 504, or $$\sigma(R_{MTJ0}) \approx \sigma(R_{MTJ1}).$$

Figure 6:
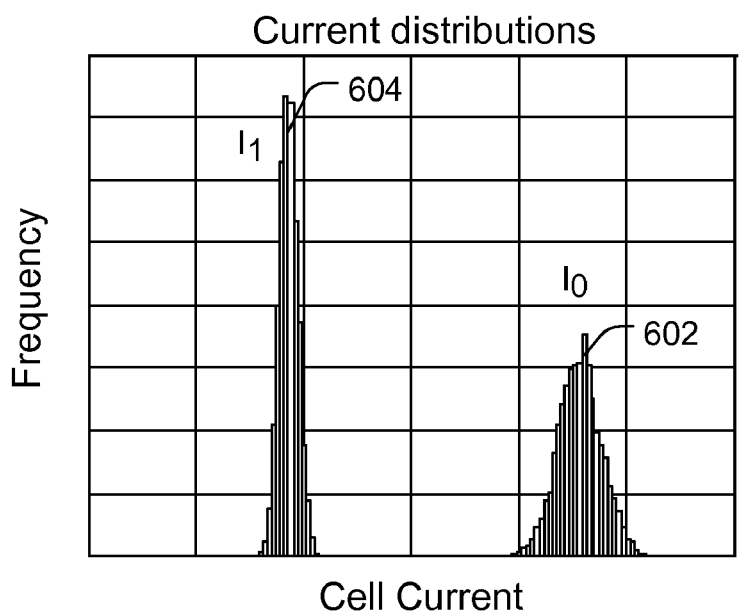
FIG. 6 is a diagram of a particular illustrative embodiment of memory cell current distributions based on the first memory cell resistance distribution characteristic of FIG. 5.

Referring to FIG. 6, a particular illustrative embodiment of memory cell current distributions based on the first memory cell resistance distribution characteristic of FIG. 5 is depicted and generally designated 600. FIG. 6 generally represents a histogram of current values having a first distribution 602 corresponding to state "0" current $I_0$ though the data cell 260 of FIG. 2 or the data cell 360 of FIG. 3, where the resistance R0 266 or 366 is given by the resistance values of the first distribution 502 of FIG. 5. A second distribution 604 corresponds to state "1" current $I_1$ though the data cell 270 of FIG. 2 or the data cell 370 of FIG. 3, where the resistance R1 276 or 376 is given by the resistance values of the second distribution 504 of FIG. 5.

Figure 7:
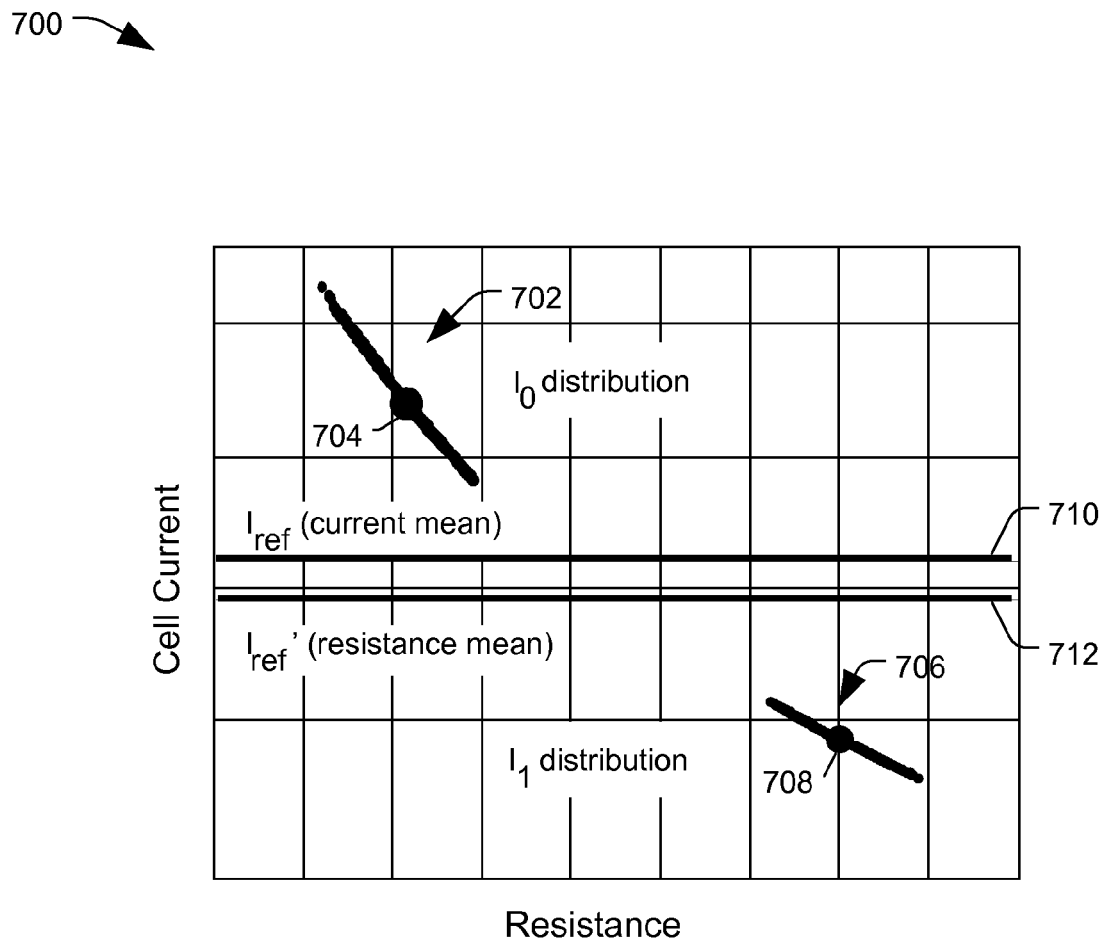
FIG. 7 is a diagram of a particular illustrative embodiment of the circuit characteristics of FIG. 4 using the first memory cell resistance distribution characteristic of FIG. 5 and the memory cell current distributions of FIG. 6.

Referring to FIG. 7, a particular illustrative embodiment of the circuit characteristics of FIG. 4 using the first memory cell resistance distribution characteristic of FIG. 5 and the memory cell current distributions of FIG. 6 is depicted and generally designated 700. A first distribution $I_0$ 702 illustrates resistance-current characteristics of the state "0" resistance distribution $R_{MTJ0}$ 502 of FIG. 5 and current distribution $I_0$ 602 of FIG. 6. The first distribution $I_0$ 702 has a mean value 704 corresponding to the mean of the resistance distribution $R_{MTJ0}$ 502 and the current distribution $I_0$ 602. A second distribution $I_1$ 706 illustrates resistance-current characteristics of the state "1" resistance distribution $R_{MTJ1}$ 504 of FIG. 5 and current distribution $I_1$ 604 of FIG. 6. The second distribution $I_1$ 706 has a mean value 708 corresponding to the mean of the resistance distribution $R_{MTJ1}$ 504 and the current distribution $I_1$ 604.

A reference current $I_{ref}$ 710 corresponds to the current Iref through the first reference cell 282 of FIG. 2 using the current mean reference scheme. A second reference current $I_{ref}$ 712 corresponds to the current Iref' through the second reference cell 284 of FIG. 2 using the resistance mean reference scheme. The $I_0$ distribution 702 is distributed over a greater range of current values than the $I_1$ distribution 704, and therefore the second reference current $I_{ref}$ 712, having a value closer to the $I_1$ mean 708 than to the $I_0$ mean 704, provides a greater overall sense margin than the first reference current $I_{ref}$ 710.

Figure 8:
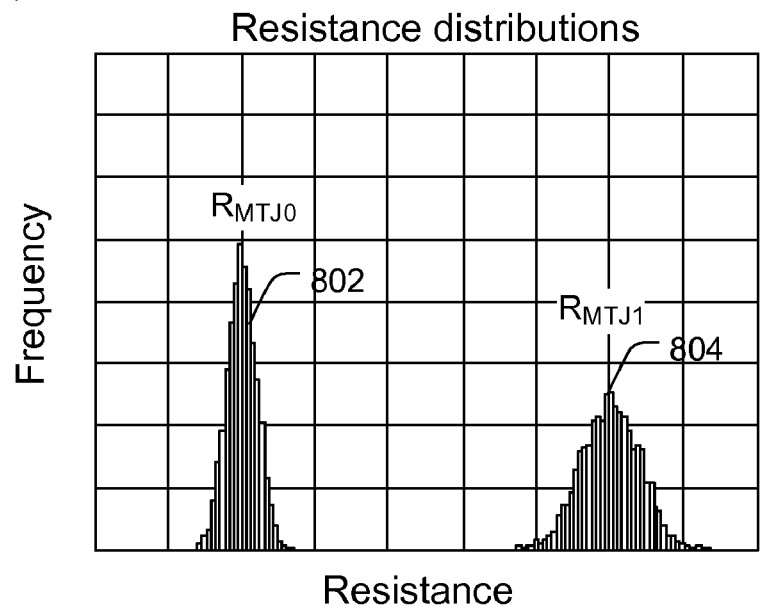
FIG. 8 is a diagram of a particular illustrative embodiment of memory cell resistances exhibiting a second memory cell resistance distribution characteristic.

Referring to FIG. 8, a particular illustrative embodiment of memory cell resistances exhibiting a second memory cell resistance distribution characteristic is depicted and generally designated 800. FIG. 8 generally represents a histogram of resistance values of a magnetic tunnel junction (MTJ) devices, showing a first distribution 802 corresponding to a "0" state $R_{MTJ0}$ and a second distribution 804 corresponding to a "1" state $R_{MTJ1}$. As illustrated, the first distribution 802 is higher and narrower than the second distribution 804. In particular, the standard deviation of the first distribution 802, divided by the mean value of the first distribution 802, is roughly equal to the standard deviation of the second distribution 804 divided by the mean value of the second distribution 804:

$$\sigma/\mu(R_{MTJ0}) \approx \sigma/\mu(R_{MTJ1}).$$

Figure 9:
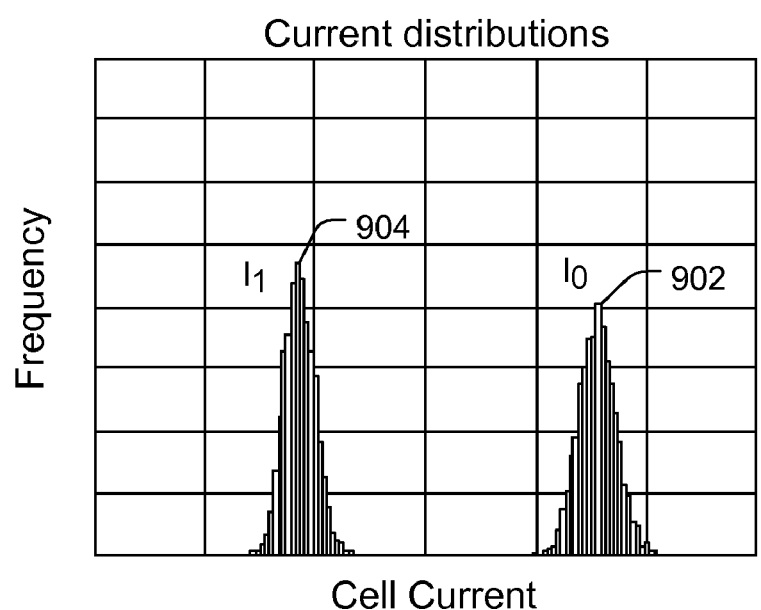
FIG. 9 is a diagram of a particular illustrative embodiment of memory cell current distributions based on the second memory cell resistance distribution characteristic of FIG. 8.

Referring to FIG. 9, a particular illustrative embodiment of memory cell current distributions based on the second memory cell resistance distribution characteristic of FIG. 8 is depicted and generally designated 900. FIG. 9 generally represents a histogram of current values having a first distribution 902 corresponding to state "0" current $I_0$ though the data cell 260 of FIG. 2 or the data cell 360 of FIG. 3, where the resistance R0 266 or 366 is given by the resistance values of the first distribution 802 of FIG. 8. A second distribution 904 corresponds to state "1" current $I_1$ though the data cell 270 of FIG. 2 or the data cell 370 of FIG. 3, where the resistance R1 276 or 376 is given by the resistance values of the second distribution 804 of FIG. 8.

Figure 10:
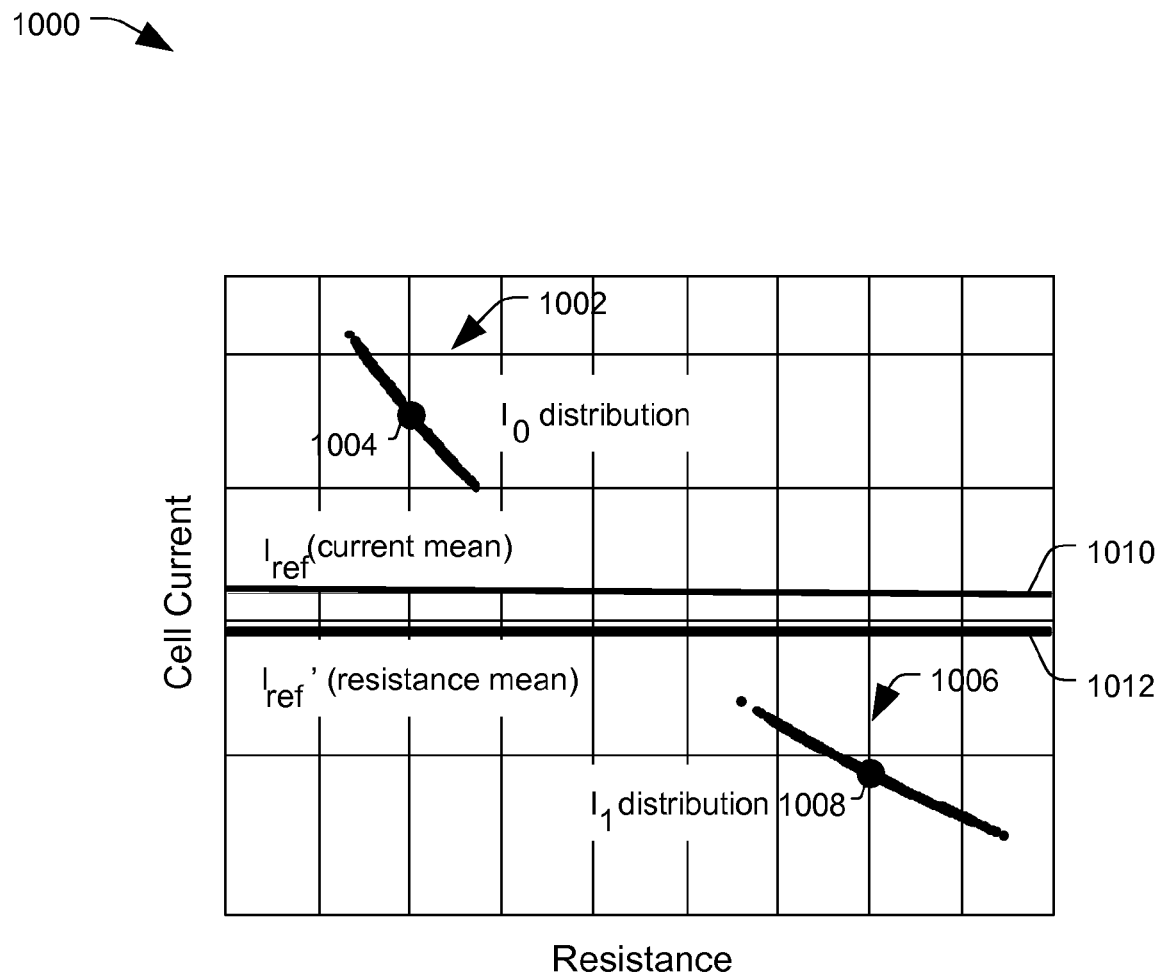
FIG. 10 is a diagram of a particular illustrative embodiment of the circuit characteristics of FIG. 4 using the second memory cell resistance distribution characteristic of FIG. 8 and the memory cell current distributions of FIG. 9.

Referring to FIG. 10, a particular illustrative embodiment of the circuit characteristics of FIG. 4 using the second memory cell resistance distribution characteristic of FIG. 8 and the memory cell current distributions of FIG. 9 is depicted and generally designated 1000. A first distribution $I_0$ 1002 illustrates resistance-current characteristics of the state "0" resistance distribution $R_{MTJ0}$ 802 of FIG. 8 and current distribution $I_0$ 902 of FIG. 9. The first distribution $I_0$ 1002 has a mean value 1004 corresponding to the mean of the resistance distribution $R_{MTJ0}$ 802 and the current distribution $I_0$ 902. A second distribution $I_1$ 1006 illustrates resistance-current characteristics of the state "1" resistance distribution $R_{MTJ1}$ 804 of FIG. 8 and current distribution $I_1$ 904 of FIG. 9. The second distribution $I_1$ 1006 has a mean value 1008 corresponding to the mean of the resistance distribution $R_{MTJ1}$ 804 and the current distribution $I_1$ 904.

A reference current $I_{ref}$ 1010 corresponds to the current Iref through the first reference cell 282 of FIG. 2 using the current mean reference scheme. A second reference current $I_{ref}$ 1012 corresponds to the current Iref' through the second reference cell 284 of FIG. 2 using the resistance mean reference scheme. In contrast to FIG. 7, the $I_1$ distribution 1004 is distributed over a greater range of current values than the $I_0$ distribution 1002, and therefore the first reference current $I_{ref}$ 1010, having a value closer to the $I_0$ mean 1004 than to the $I_1$ mean 1008, provides a greater overall sense margin than the second reference current $I_{ref}$ 1012.

In general, FIGS. 5-10 illustrate that for fabrication processes resulting in process variations where $\sigma(R_{MTJ0}) \approx \sigma$ ($R_{MTJ1}$), a resistance mean reference scheme can generally provide a better sense margin than a current mean reference scheme. For fabrication processes resulting in process variations where $\sigma/\mu$ ($R_{MTJ0}$)≈$\sigma/\mu$($R_{MTJ1}$), a current mean reference scheme can generally provide a better sense margin than a resistance mean reference scheme. Thus, once a process variation is characterized, memory circuits having a controlled value reference signal, such as depicted in FIGS. 1-3 can be programmed to use one or more reference signals that are appropriate for the type of process variation to improve system performance by increasing sense margins.

Figure 11:
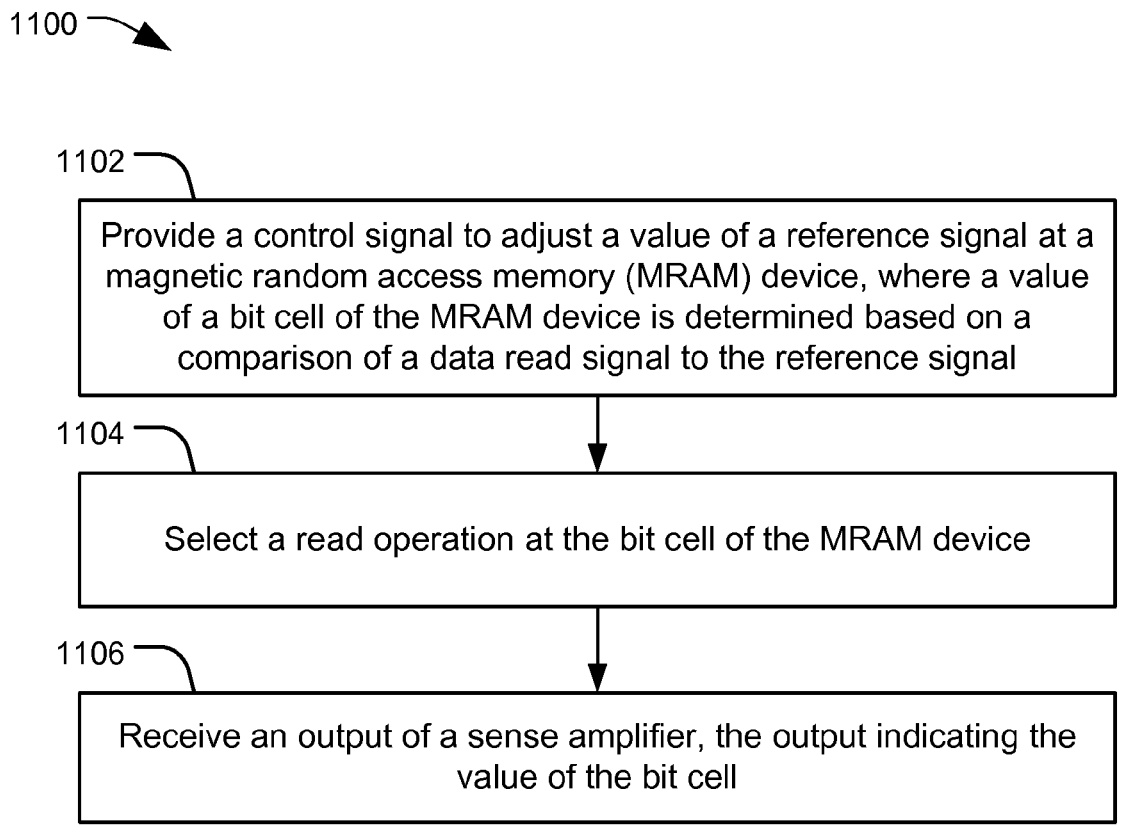
FIG. 11 is a flow diagram of a particular embodiment of a method of operating a resistance based memory circuit having a controlled value reference signal.

Referring to FIG. 11, a flow diagram of a particular embodiment of a method of operating a resistance based memory circuit having a controlled value reference signal is depicted and generally designated 1100. As illustrative examples, the resistance based memory circuit may include a magnetoresistive random access memory (MRAM), a phase-change random access memory (PRAM), a spin torque transfer MRAM (STT-MRAM), or other resistance based memory devices. In an illustrative embodiment, the method 1100 may be performed at any of the systems of FIGS. 1-3.

At 1102, a control signal is provided to adjust a value of a reference signal at a magnetic random access memory (MRAM) device, where a value of a bit cell of the MRAM device is determined based on a comparison of a data read signal to the reference signal. In a particular embodiment, the control signal is determined by observing process variations of the MRAM device and setting one or more values via a register interface. Continuing to 1104, a read operation is selected at the bit cell of the MRAM device. Proceeding to 1106, an output of a sense amplifier is received. The output indicates the value of the bit cell.

In a particular embodiment, the control signal is provided to selection logic to provide a first output of a first reference cell or a second output of a second reference cell to a sense amplifier. For example, the control signal may include the reference selection signal 216 that is received at the multiplexer 218 to select Vout_refc or Vout_refr of FIG. 2.

In another particular embodiment, the control signal is provided to a control terminal of a clamping transistor of a reference cell, such as the signal Vclamp2 at the control input 386 of FIG. 3. A p-channel metal oxide semiconductor (PMOS) field effect transistor load may be controlled by a load control output of a load generation cell that is independent of the control signal, such as the gate voltage generator 380 of FIG. 3.

The control signal may be determined to provide an improved sense margin for the MRAM device. For example, where process variations exhibit resistance distribution characteristics similar to FIG. 5, the control signal may adjust the reference signal to correspond to a selection of a resistance mean reference cell. Where the process variations exhibit resistance distribution characteristics similar to FIG. 8, the control signal may adjust the reference signal to correspond to a selection of a current mean reference cell.

Figure 12:
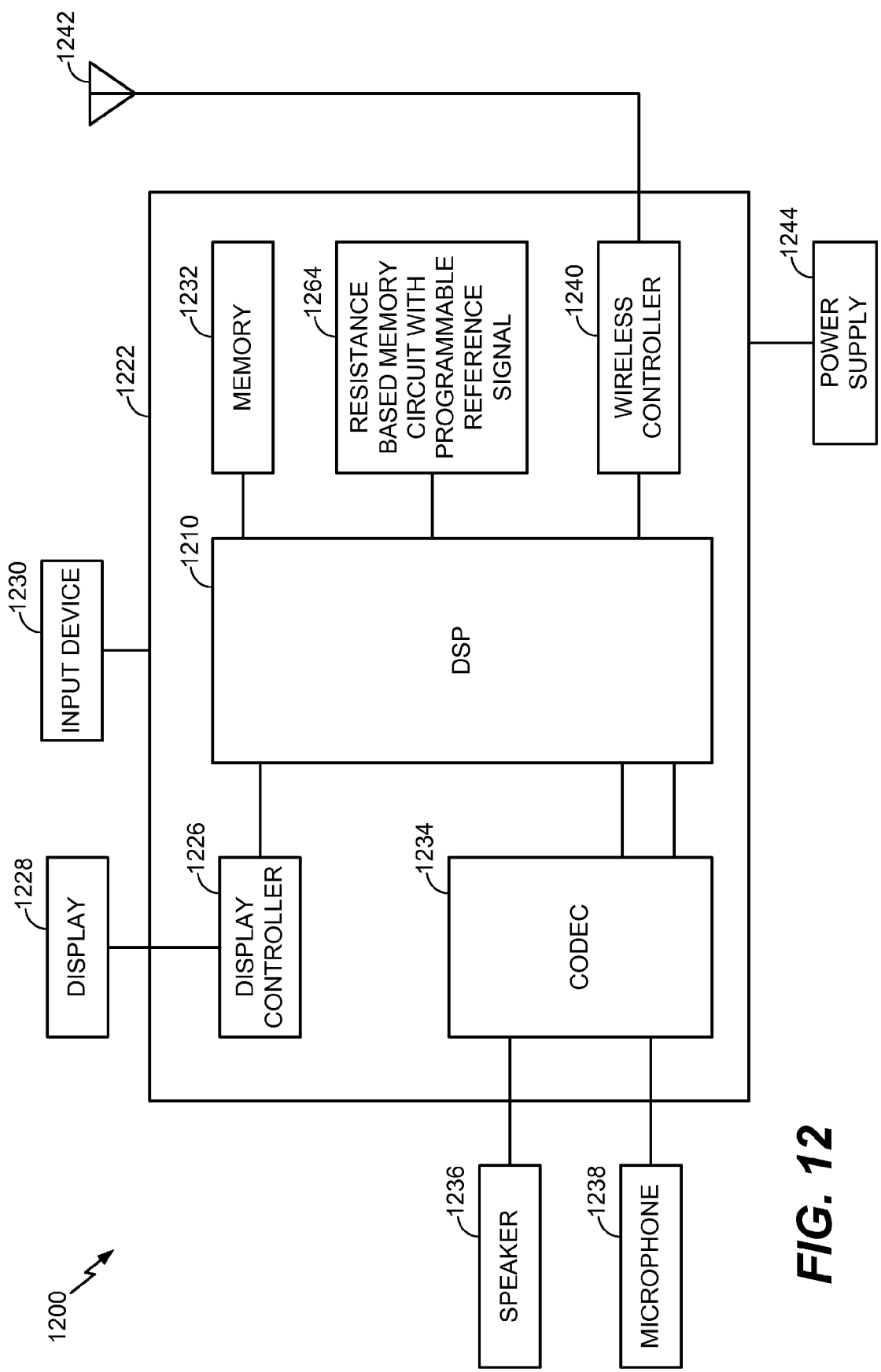
FIG. 12 is a block diagram of a particular illustrative embodiment of an electronic device including a resistance based memory circuit with a programmable reference signal.

Referring to FIG. 12, a block diagram of a particular illustrative embodiment of an electronic device including a resistance based memory circuit with a programmable reference signal is depicted and generally designated 1200. The device 1200 includes a processor, such as a digital signal processor (DSP) 1210, coupled to a memory 1232 and also coupled to a resistance based memory circuit with a programmable reference signal 1264. In an illustrative example, the resistance based memory circuit with a programmable reference signal 1264 includes any of the systems of FIGS. 1-3 and may operate in accordance with the method of FIG. 11. In a particular embodiment, the resistance based memory circuit with a programmable reference signal 1264 includes a spin torque transfer magnetoresistive random access memory (STT-MRAM) memory device.

FIG. 12 also shows a display controller 1226 that is coupled to the digital signal processor 1210 and to a display 1228. A coder/decoder (CODEC) 1234 can also be coupled to the digital signal processor 1210. A speaker 1236 and a microphone 1238 can be coupled to the CODEC 1234.

FIG. 12 also indicates that a wireless controller 1240 can be coupled to the digital signal processor 1210 and to a wireless antenna 1242. In a particular embodiment, the DSP 1210, the display controller 1226, the memory 1232, the CODEC 1234, the wireless controller 1240, and the resistance based memory circuit with a programmable reference signal 1264 are included in a system-in-package or system-on-chip device 1222. In a particular embodiment, an input device 1230 and a power supply 1244 are coupled to the system-on-chip device 1222. Moreover, in a particular embodiment, as illustrated in FIG. 12, the display 1228, the input device 1230, the speaker 1236, the microphone 1238, the wireless antenna 1242, and the power supply 1244 are external to the system-on-chip device 1222. However, each can be coupled to a component of the system-on-chip device 1222, such as an interface or a controller.

In conjunction with the disclosed systems and methods, a variable reference signal generator for a resistance based memory device can be provided to improve a sense margin based on a characteristic of observed process variations of the resistance based memory device. The variable reference signal generator has an input to receive a control signal, such as the reference selection signal 216 of FIG. 2 or the Vclamp2 signal at the control input 386 of FIG. 3. The variable reference signal generator has an output responsive to the input and logic to provide a controlled value reference signal at the output for use in connection with a sense amplifier of the resistance based memory device. For example, the logic to provide the controlled value reference signal may include the multiplexer 218 of FIG. 2.

The variable reference signal generator may include a first memory means for storing a data value, a first load means for providing a resistive load, and a first clamp means for controlling the first current, where the first clamp means is coupled to the input to control a value of the controlled value reference signal. For example, the first memory means can include the MTJ device 114 of FIG. 1, the resistances 266, and 276 of FIG. 2, and the resistances 366 and 376 of FIG. 3. Examples of the first load means include the sense amplifier portion 212 of the data cells 260 and 270 of FIG. 2, and the sense amplifier portion 312 of the data cells 360 and 370 of FIG. 3. Examples of the first clamp means include clamp devices and circuits, such as the clamp transistors 264 and 274 of FIG. 2, and the clamp transistors 364 and 374 of FIG. 3.

The first load means can be coupled to receive a load control signal from a load generator cell, such as the gate voltage generator 380 of FIG. 3. The load generator cell can include a second memory means for storing a data value, a second load means for providing a resistive load, and a second clamp means for controlling a second current. Examples of the second memory means include the resistances 326 and 336 of FIG. 3. Examples of the second load means include the sense amplifier portion 312 of the gate voltage generator 380 of FIG. 3, including load devices such as the PMOS loads 322 and 332. The second clamp means can include clamp devices and circuits, such as the clamp transistors 324 and 334 of FIG. 3.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A sense amplifier comprising:
   a first input coupled to at least one magnetoresistive random access memory (MRAM) bit cell; and
   a second input adapted to receive an input signal comprising a controlled value reference voltage, wherein the controlled value reference voltage is provided by a MRAM reference cell that is configured to adjust the controlled value reference voltage in response to a control input, wherein the control input is coupled to a control terminal of a first current clamp device of the MRAM reference cell, wherein the MRAM reference cell comprises a first load circuit and the MRAM bit cell comprises a second load circuit, and wherein the first load circuit and the second load circuit receive a load control signal from a MRAM load generator cell.

2. The sense amplifier of claim 1, wherein the controlled value reference voltage is programmable.

3. The sense amplifier of claim 1, wherein the MRAM bit cell comprises a second current clamp device, wherein the MRAM load generator cell comprises a third current clamp device, and wherein the second current clamp device and the third current clamp device are controlled by a clamp control signal that is independent of the control input to the first current clamp device.

4. A magnetoresistive random access memory (MRAM) device, comprising:
   a reference cell to generate a controlled value reference signal in response to a control input that is received at the reference cell, wherein the control input is coupled to a control terminal of a first current clamp device of the reference cell, and wherein the reference cell comprises a first load circuit;
   a data cell to generate a data signal responsive to a data value stored at the data cell, wherein the data cell comprises a second load circuit
   a load generator cell coupled to provide a load control signal to the first load circuit and to the second load circuit; and
   a sense amplifier coupled to receive the controlled value reference signal and the data signal and to generate an output that indicates the data value.

5. The MRAM device of claim 4, wherein the controlled value reference signal includes a reference current or a reference voltage.

6. A method, comprising:
   providing a control signal to a control terminal of a clamping transistor of a reference cell to adjust a value of a reference signal at a magnetic random access memory (MRAM) device, wherein a value of a bit cell of the MRAM device is determined based on a comparison of a data read signal to the reference signal, wherein a p-channel metal oxide semiconductor (PMOS) field effect transistor load is controlled by a load control output of a load generation cell that is independent of the control signal.

7. The method of claim 6, wherein the control signal is provided to selection logic to provide a first output of a first reference cell or a second output of a second reference cell to a sense amplifier.

8. The method of claim 6, further comprising:
   selecting a read operation at the bit cell of the MRAM device; and
   receiving an output of a sense amplifier, the output indicating the value of the bit cell.

9. The sense amplifier of claim 1 integrated into at least one semiconductor die.

10. An apparatus comprising:
    means for receiving a reference control signal, wherein the means for receiving the reference control signal is coupled to at least one magnetoresistive random access memory (MRAM) bit cell; and
    means for receiving a controlled value reference voltage, wherein the controlled value reference voltage is provided by a MRAM reference cell that is configured to adjust the controlled value reference voltage in response to a control input, wherein the control input is coupled to a control terminal of a first current clamp device of the MRAM reference cell, wherein the MRAM reference cell comprises a first load circuit and the MRAM bit cell comprises a second load circuit, and wherein the first load circuit and the second load circuit receive a load control signal from a MRAM load generator cell.

11. The apparatus of claim 10 integrated in at least one semiconductor die.

12. A method comprising:
    a first step for providing a control signal to a control terminal of a clamping transistor of a reference cell to adjust a value of a reference signal at a magnetic random access memory (MRAM) device, wherein a value of a bit cell of the MRAM device is determined based on a comparison of a data read signal to the value of the reference signal; and a second step for controlling a p-channel metal oxide semiconductor (PMOS) field effect transistor load, wherein the PMOS field effect transistor load is controlled by a load control output of a load generation cell, wherein the load control output is independent of the control signal.

13. The method of claim 12, wherein the first step and the second step are performed by a processor integrated into an electronic device.

14. A computer readable tangible medium storing instructions executable by a computer, the instructions comprising:

instructions that are executable by the computer to provide a control signal to a control terminal of a clamping transistor of a reference cell to adjust a value of a reference signal at a magnetic random access memory (MRAM) device, wherein a value of a bit cell of the MRAM device is determined based on a comparison of a data read signal to the value of the reference signal, wherein a p-channel metal oxide semiconductor (PMOS) field effect transistor load is controlled by a load control output of a load generation cell, wherein the load control output is independent of the control signal.

15. A circuit device comprising:

a first input configured to receive a reference control signal; and an output responsive to the first input to selectively provide one of a first reference voltage and a second reference voltage to a sense amplifier coupled to a resistance based memory cell;

wherein the first reference voltage is provided by a first reference cell having a first reference resistance based memory element in a bit-zero state serially coupled to a second reference resistance based memory element in a bit-one state, and wherein the second reference voltage is provided by a second reference cell having a third reference resistance based memory element in the bit-zero state coupled in parallel with a fourth reference resistance based memory element in the bit-one state.

16. The circuit device of claim 15, wherein the resistance based memory cell includes a magnetic tunnel junction (MTJ) device.

17. The circuit device of claim 15, further comprising:

a first reference current path to provide a first controlled value reference voltage; and a second reference current path to provide a second controlled value reference voltage.

18. The circuit device of claim 15, wherein the reference control signal is selected based on sense margin sensitivity information.

19. The circuit device of claim 18, wherein the sense margin sensitivity information includes cell-by-cell information, chip-by-chip information, multi-chip information, or process based information.

* * * * *

UNITED STATES PATENT AND TRADEMARK OFFICE
CERTIFICATE OF CORRECTION

PATENT NO. : 7,813,166 B2  Page 1 of 1
APPLICATION NO. : 12/164436
DATED : October 12, 2010
INVENTOR(S) : Seong-Ook Jung et al.

It is certified that error appears in the above-identified patent and that said Letters Patent is hereby corrected as shown below:

Title Page, Item [73], After the first assignee add the following: Industry-Academic Cooperation Foundation, Yonsei University, Seoul, Korea (KR)

To be listed as follows:

[73]    Assignees: QUALCOMM Incorporated, San Diego, CA (US)
        Industry-Academic Cooperation Foundation, Yonsei University, Seoul, Korea (KR)

Signed and Sealed this

Fourteenth Day of December, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,813,166 B2 |
| APPLICATION NO. | : 12/164436 |
| DATED | : October 12, 2010 |
| INVENTOR(S) | : Jung et al. |

It is certified that error appears in the above-identified patent and that said Letters Patent is hereby corrected as shown below:

Title Page, Item (75) Inventors: change, "Jisu Kim," to read as --Ji-Su Kim,--

Column 14, line 14, claim 4: "circuit" to read as --circuit;--

Signed and Sealed this
Twenty-sixth Day of July, 2011

David J. Kappos
*Director of the United States Patent and Trademark Office*